United States Patent [19]

Ikeda et al.

[11] Patent Number: 5,196,283
[45] Date of Patent: Mar. 23, 1993

[54] X-RAY MASK STRUCTURE, AND X-RAY EXPOSURE PROCESS

[75] Inventors: Tsutomu Ikeda, Tokyo; Masao Sugata; Hideo Kato, both of Yokohama, all of Japan

[73] Assignee: Canon Kabushiki Kaisha, Tokyo, Japan

[21] Appl. No.: 489,277

[22] Filed: Mar. 6, 1990

[30] Foreign Application Priority Data

Mar. 9, 1989 [JP] Japan .................................. 1-55031
Feb. 23, 1990 [JP] Japan .................................. 2-41110
Mar. 1, 1990 [JP] Japan .................................. 2-47238

[51] Int. Cl.$^5$ ............................................. G03F 9/00
[52] U.S. Cl. ............................................. 430/5; 378/34; 378/35
[58] Field of Search .................... 430/5; 378/34, 35

[56] References Cited

U.S. PATENT DOCUMENTS

| 4,677,042 | 6/1987 | Kato et al. | 430/5 |
| 4,735,877 | 5/1988 | Kato et al. | 430/5 |
| 4,804,600 | 2/1989 | Kato et al. | 430/5 |
| 4,837,123 | 4/1989 | Kato et al. | 430/269 |
| 5,012,500 | 4/1991 | Watanabe et al. | 378/35 |

FOREIGN PATENT DOCUMENTS

| 118754 | 6/1986 | Japan | 378/35 |
| 62-080656 | 4/1987 | Japan | . |
| 63-076872 | 4/1988 | Japan | . |
| 76325 | 6/1988 | Japan | 378/35 |
| 63-232425 | 9/1988 | Japan | . |
| 63-317676 | 12/1988 | Japan | . |

OTHER PUBLICATIONS

T. Kanayma et al. "Reduction in X-ray Mass Distortion Using Amorphous WN Absorber Stress Compensated with Ion Bombardment", Journal of Vacuum Science and Technoloy, Part B, vol. 6, No. 1, pp. 174–177, Feb. 1988 New York.

Primary Examiner—Charles L. Bowers, Jr.
Assistant Examiner—Thomas R. Neville
Attorney, Agent, or Firm—Fitzpatrick, Cella, Harper & Scinto

[57] ABSTRACT

The present invention provides an X-ray mask structure having an X-ray transmissive membrane, an X-ray absorber held on an X-ray transmissive membrane, and a holding frame that holds the X-ray transmissive membrane, and the X-ray transmissive membrane has a layer of aluminum nitride, and the X-ray absorber has a heavy metal nitride.

20 Claims, 9 Drawing Sheets

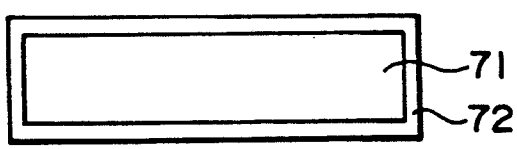
F I G. 7A
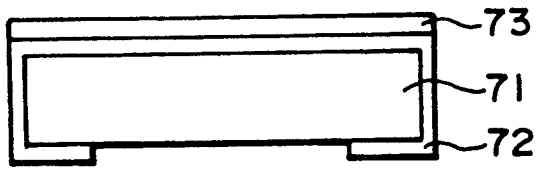
F I G. 7E
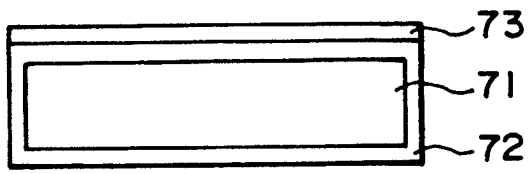
F I G. 7B
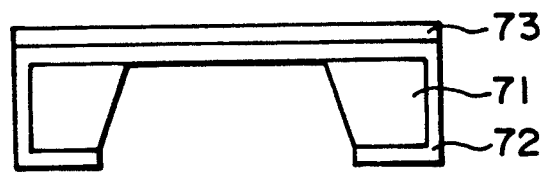
F I G. 7F
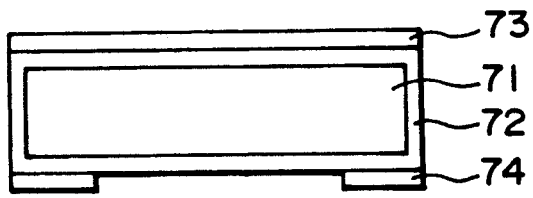
F I G. 7C
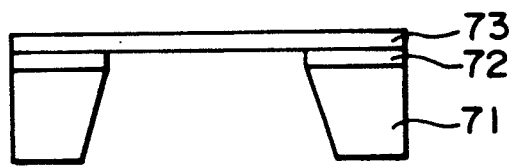
F I G. 7G
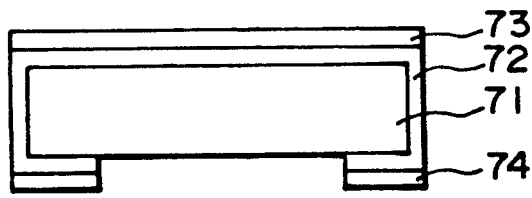
F I G. 7D
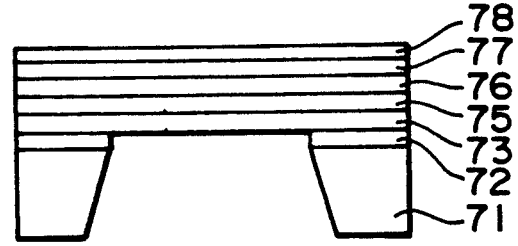
F I G. 7H
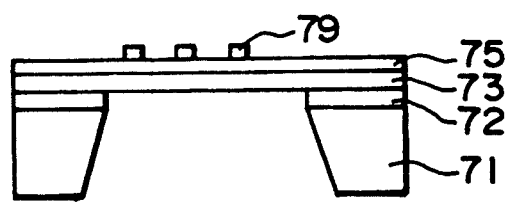
F I G. 7I

X-RAY MASK STRUCTURE, AND X-RAY EXPOSURE PROCESS

BACKGROUND OF THE INVENTION

1. Field of the Invention

The present invention relates to an X-ray mask structure used in X-ray lithography, and an X-ray exposure process using the same.

2. Related Background Art

The X-ray mask structure used in X-ray lithography is mainly comprised of an X-ray transmissive membrane, an X-ray absorber held on the X-ray transmissive membrane, and a holding frame that holds the X-ray transmissive membrane.

In the field of X-ray lithography, a high resolution of a half-micron order has been hitherto required for the pattern line width.

The main reason to decrease the high resolution originates from the mask structure, and is based on the following problems involved in the X-ray mask structure itself:

1) A problem of deterioration of an X-ray transmission performance originating from an X-ray transmissive membrane;
2) A problem of the strain produced in an X-ray transmissive membrane, caused by internal stress;
3) A problem of the strain produced in an X-ray absorber, caused by internal stress; and
4) A problem of the adhesion between an X-ray transmissive membrane and an X-ray absorber.

In order to solve the above problems, various technical improvements have been hitherto made. For example, U.S. Pat. No. 4,677,042 discloses that an X-ray mask structure in which aluminum nitride is used in the X-ray transmissive membrane, and a heavy metal such as tungsten or tantalum is used as the X-ray absorber, can solve, in particular, the above problem 1). Japanese Patent Laid-Open Nos. 63-76325 and 63-32425 also disclose that an X-ray mask structure in which silicon nitride, silicon oxide or boron nitride is used in the X-ray transmissive membrane, and a nitride of tungsten, a nitride of tantalum or a nitride of titanium-tungsten is used as the X-ray absorber, can solve, in particular, the above problems 3) and 4).

In practical use in X-ray lithography, however, even the X-ray mask structures disclosed in the above prior arts have caused the following new problems.

Namely, in the practical use in X-ray lithography;

(i) it is conventional to carry out pattern exposure a thousand times or as many as several ten thousand times using the same X-ray mask structure, and as a result of such repeated pattern exposure, a strain is produced with time in the X-ray mask structure, resulting in a decrease in the resolution of patterns; and (ii) the X-ray mask structure is often used under a reduced pressure for the purpose of preventing attenuation of X-rays at the time of exposure, where a strain is also produced in the X-ray mask structure as a result of repeated pressure variations that occur when an exposing object (e.g., a wafer) is attached to or detached from a device, resulting in a continual decrease with time of the resolution of patterns. Thus, the conventional X-ray mask structures have been unsatisfactory in respect of the durability thereof.

SUMMARY OF THE INVENTION

Accordingly, an object of the present invention is to solve the above problems 1) to 4) conventionally arising, and also to provide an X-ray mask structure that has a high enough durability to protect against the pattern exposure repeated a thousand times or as many as several ten thousand times to the same X-ray mask structure as well as the pressure variations repeated a thousand times or as many as several ten thousand times to the same X-ray mask structure, and does not cause any changes (deterioration) in the resolution of patterns with time.

Another object of the present invention is to provide an X-ray exposure process using the above X-ray mask structure capable of achieving a high accuracy and high resolution.

The above objects can be achieved by the invention as described below.

The present invention relates to an X-ray mask structure comprising an X-ray transmissive membrane, an X-ray absorber held on said X-ray transmissive membrane, and a holding frame that holds said X-ray transmissive membrane, wherein;

said X-ray transmissive membrane comprises a layer of aluminum nitride; and said X-ray absorber comprises a nitride of heavy metal.

The present invention also relates to an X-ray mask structure comprising an X-ray transmissive membrane, an X-ray absorber held on said X-ray transmissive membrane, and a holding frame that holds said X-ray transmissive membrane, wherein;

said X-ray transmissive membrane comprises a layer of aluminum nitride;

said X-ray absorber comprises a nitride of heavy metal; and an intermediate layer mainly composed of aluminum, a heavy metal and nitrogen is held between said X-ray transmissive membrane and said X-ray absorber.

The present invention further relates to an X-ray exposure process comprising an exposing object to X rays through an X-ray mask structure comprising an X-ray transmissive membrane, an X-ray absorber held on said X-ray transmissive membrane, and a holding frame that holds said X-ray transmissive membrane, wherein;

said X-ray transmissive membrane comprises a layer of aluminum and;

said X-ray absorber comprises a nitride of heavy metal.

The present invention further relates to an X-ray exposure process comprising an exposing object to X rays through an X-ray mask structure comprising an X-ray transmissive membrane, an X-ray absorber held on said X-ray transmissive membrane, and a holding frame that holds said X-ray transmissive membrane, wherein;

said X-ray transmissive membrane comprises a layer of aluminum nitride;

said X-ray absorber comprises a nitride of heavy metal; and an intermediate layer mainly composed of aluminum, a heavy metal and nitrogen is held between said X-ray transmissive membrane and said X-ray absorber.

DETAILED DESCRIPTION OF THE PREFERRED EMBODIMENTS

The X-ray mask structure of the present invention is mainly characterized in that the X-ray transmissive membrane has a layer comprising aluminum nitride, and a nitride of heavy metal is used as the X-ray absorber. Having such constitution, the X-ray mask structure of the present invention can maintain a durability or endurance high enough to protect against, in particular, the expansion and shrinkage of the whole mask structure, caused by the exposure to X-rays repeated a thousand times or as many as several ten thousand times in practical use, and the vibration of the X-ray transmissive membrane and the X-ray absorber, caused by the pressure variations also repeated a thousand times or as many as several ten thousand times. Although the reasons for the above have not been definitely determined, the present inventors presume the following factors a) to c): a) The X-ray transmissive membrane mainly composed of aluminum and nitrogen has a low coefficient of thermal expansion and also has a high thermal conductivity. For example, aluminum nitride (Al-N) shows a coefficient of thermal expansion of 4.3 ppm/° C. and a thermal conductivity of 260 W/m.K.

This coefficient of thermal expansion is substantially the same value as that of the silicon wafer commonly preferably used as a substrate on which a conductive pattern is printed, and the thermal conductivity is much better than that of the silicon nitride (17 to 30 W/m.K) widely used in the X-ray transmissive membrane. Thus, it becomes possible to prevent the temperature elevation due to X-ray absorption.

b) The aluminum nitride (the X-ray transmissive membrane) and the nitride of heavy metal (the X-ray absorber) are in optimum combination from the viewpoint of the adhesion between both.

c) The balance of stress between the aluminum nitride (the X-ray transmissive membrane) and the nitride of heavy metal (the X-ray absorber) are in optimum condition.

The X-ray mask structure of the present invention will be described below in detail with reference to the accompanying drawings.

FIGS. 1A to 1D and FIGS. 2A to 2E are cross sectional views each illustrating the constitution of the X-ray mask structure of the present invention.

Figure 1A:
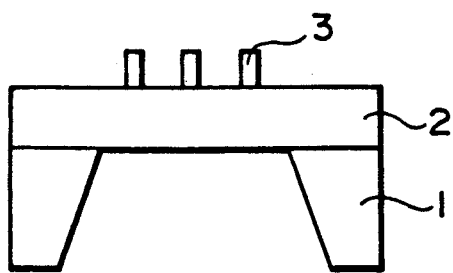
FIGS. 1A-1D and 2A-2E illustrate X-ray mask structures according to the present invention.

In FIG. 1A, the numeral 1 denotes a holding frame; numeral 2 denotes an X-ray transmissive membrane; and numeral 3 denotes an X-ray absorber. First of all, the X-ray transmissive membrane 2 is composed of aluminum nitride. Molar ratio (N/Al) of aluminum (Al) to Nitrogen (N) should preferably range from 0.3 to 1.5, and more preferably from 0.7 to 1.0. More specifically, a molar ratio of more than 1.5 may result in decreasing the transmittance of X-rays, and a molar ratio of less than 0.3 makes it difficult to control the internal stress. Moreover, a molar ratio outside the range of from 0.3 to 1.5 may also result in decreasing the practical durability previously mentioned. The X-ray transmissive membrane 2 may usually have a film thickness of from 0.5 $\mu$m to 5 $\mu$m.

The X-ray absorber 3 is composed of the nitride of heavy metal. As the heavy metal, W, Ta, Hf, Mo, Nb, Zr, Ni, Ti, Rh, Ge, Ga, or alloys of these can be used. In particular, Ta, W, Hf can be preferably used. Molar ratio x of the heavy metal to nitrogen may preferably be in the range of $0 < x < 1.0$, and more preferably $0.01 < x < 0.5$. More specifically, a molar ratio of 0 makes it difficult to control the internal stress, and a molar ratio of more than 1.0 may cause a lowering in the ability of X-ray absorption. Moreover, a molar ratio outside the range of $0 < x < 1.0$ may also cause a lowering in the practical durability previously mentioned. The X-ray absorber 3 may usually have a film thickness of from 0.02 $\mu$m to 5 $\mu$m. The X-ray transmissive membrane 2 and the X-ray absorber 3 described above may preferably be laminated in direct contact with each other from the viewpoint of the practical durability previously mentioned.

The holding frame 1 holds thereon the X-ray transmissive membrane 2 and the X-ray absorber 3. It may usually be composed of a material such as Pyrex glass, Ti, or an Ti alloy.

Figure 1B:
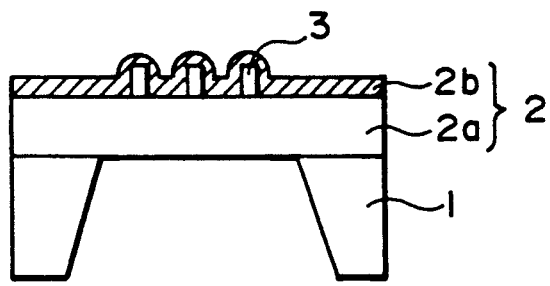
Figure 1C:
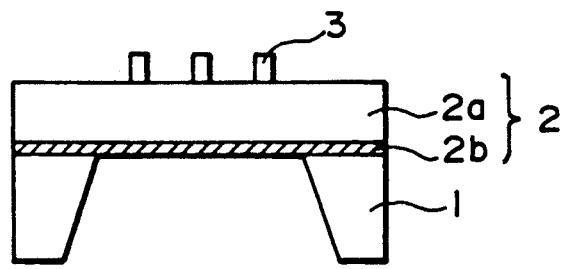
Figure 1D:
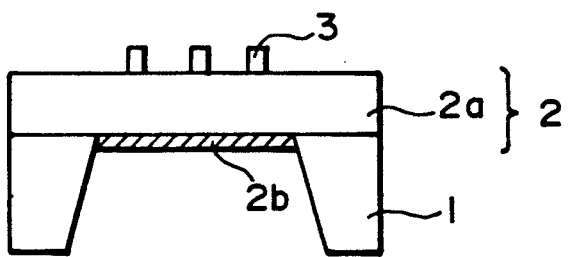

As FIGS. 1B to 1D show, in the X-ray mask structure of the present invention, the X-ray transmissive membrane 2 may also be composed of the layer 2a of aluminum nitride and the protective layer 2b. In this embodiment also, the layer 2 of aluminum nitride and the X-ray absorber 3 may preferably be laminated in direct contact with each other from the view point of the practical durability previously mentioned.

This protective layer 2b has a function of further improving the practical durability previously mentioned. Organic materials, such as polyimide, polyamide, polyester and polyparaxylylene or inorganic materials such as Be, Ti, Si and B can be used for the protective layer 2b, but the organic materials are preferred. The protective layer should have a film thickness from 0.5 $\mu$m to 3 $\mu$m.

Figure 2A:
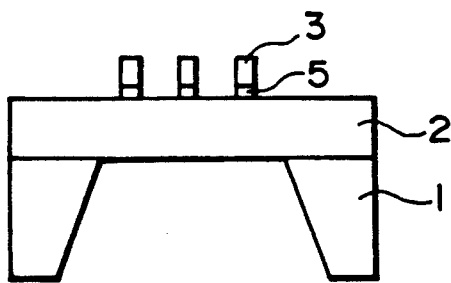

The X-ray mask structure of the present invention is mainly characterized by the constitution as described above. FIGS. 2A to 2E show another embodiment of the present invention, particularly preferred from the viewpoint of the practical durability previously mentioned. More specifically, this embodiment is additionally characterized in that, in the X-ray mask structure previously shown in FIGS. 1A to 1D, the X-ray mask structure is provided between the X-ray transmissive membrane 2 and the X-ray absorber 3 with the intermediate layer 5 mainly composed of aluminum, a heavy metal and nitrogen. As FIG. 2A shows, this intermediate layer 5 may be formed only between the X-ray mask structure 2 and the X-ray absorber 3. Alternatively, as FIG. 2B shows, it may also be formed over the whole surface of the X-ray transmissive membrane 2 on the side on which the X-ray absorber 3 is provided.

The structure shown in FIG. 2B can be obtained when the etching of the X-ray absorber is stopped in mid course, and the structure shown in FIG. 2A can be obtained when the etching is completely carried out in the process of making the X-ray mask structure.

In other words, the difference in structure can be made only by changing processing conditions (in particular, the etching time). The structure shown in FIG. 2A, however, is more advantageous in view of the fact that the transmittance of the visible light used in the mask alignment in X-ray lithography can be remarkably improved.

Here, the compositional ratio of aluminum, a heavy metal and nitrogen in the intermediate layer 5 may preferably be set to be 1:3 to 0.001:5 to 0.3. This is particularly desirable from the viewpoint of durability.

The intermediate layer 5 may preferably have a film thickness from 0.01 μm to 3 μm from the viewpoint of the practical durability previously mentioned.

Figure 2D:
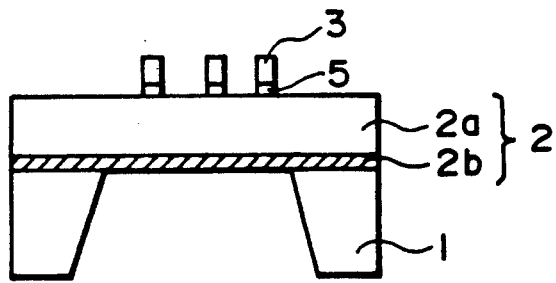
Figure 2B:
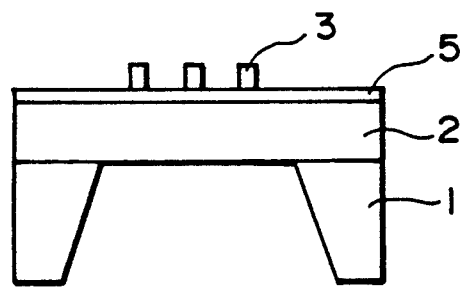
Figure 2E:
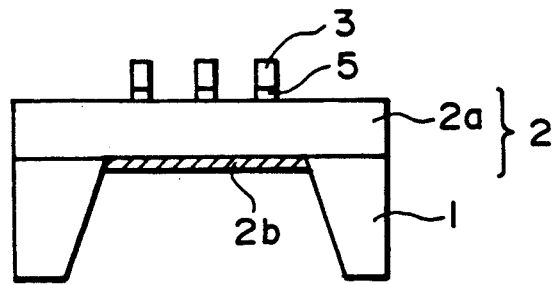
Figure 2C:
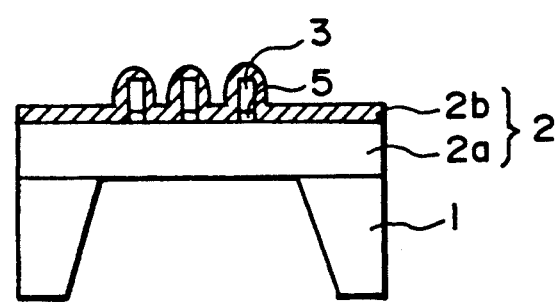

As to FIGS. 2C to 2E, in the present embodiment, the protective layer 2b having a function previously mentioned may be provided as a part of the X-ray transmissive membrane 2. In this instance, however, the intermediate layer 5 may be preferably laminated in direct contact with both the layer 2 of aluminum nitride and the X-ray absorber 3. This is preferred from the viewpoint of the practical durability previously mentioned.

The X-ray mask structure of the present invention has been detailed in the above. A sub-layer for controlling stress or for processing may also be interposed between the holding frame and the X-ray transmissive membrane. The layer can be prepared by conventional methods, without any particular limitations.

The X-ray mask structure of the present invention as described above is improved in that the X-ray transmission of the X-ray transmissive membrane, causes less strain in the X-ray transmissive membrane and the X-ray absorber when they are prepared and exposed to X-rays, and also in improved adhesion between the X-ray transmissive membrane and the X-ray absorber, so that it becomes possible to transfer patterns with high accuracy and also the X-ray absorber can be protected against collapse when it is prepared or used.

In the practical use in X-ray lithography, it is also possible to provide an X-ray mask structure that has a durability high enough to protect even against the pattern exposure repeated a thousand times or as many as several ten thousand times to the same X-ray mask structure and the pressure variations repeated a thousand times or as many as several ten thousand times to the same X-ray mask structure, and does not cause any changes (deterioration) in the resolution of patterns with time.

EXAMPLES

The present invention will be described below in greater detail by giving Examples.

Example 1

Figure 3A:
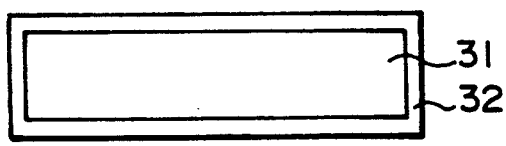
FIGS. 3A-3I to 9A-9F are views to explain processes of preparing the X-ray mask structure of the present invention.
Figure 3E:
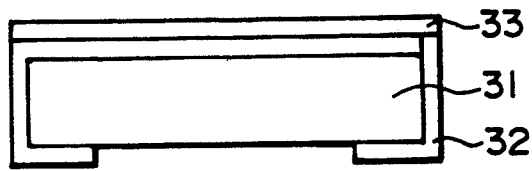
Figure 3B:
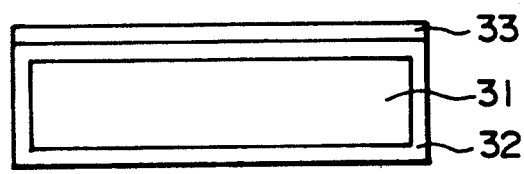

The silicon wafer 31 having on its whole surface the thermally oxidized film (SiO$_2$) 32 of 1 μm thick (FIG. 3A) was set in a sputtering apparatus, and the aluminum nitride film 33 (N/Al=1/1) of 2 μm thick was formed using an aluminum nitride (Al-N) target under conditions of argon (Ar): nitrogen (N$_2$)=5:1, a gas pressure of 0.01 Torr and a discharge electric power of 200 W (FIG. 3B).

Figure 3F:
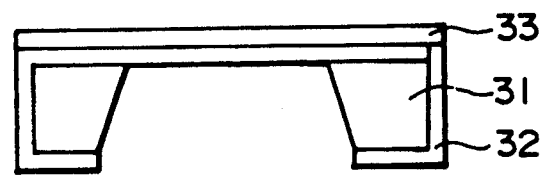
Figure 3C:
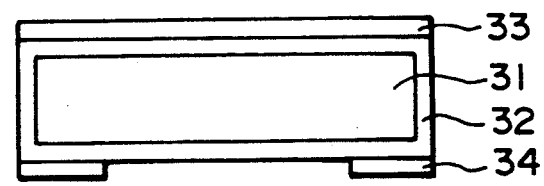
Figure 3G:
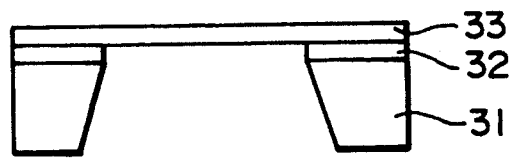
Figure 3D:
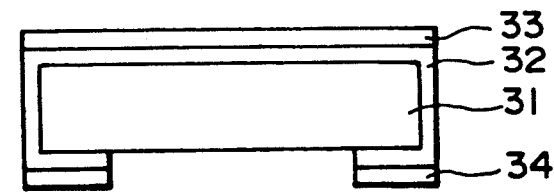

Next, in order to leave the thermally oxidized film 32 in the shape of a ring, the Apiezon wax (a product of Shell Chemical Co.) layer 34 was formed (FIG. 3C), and, using this layer as a resist layer, the middle area of the thermally oxidized film 32 (a sub-layer) was removed using a mixed solution of ammonium fluoride and hydrofluoric acid (FIG. 3D).

Thereafter, the Apiezon layer 34 was removed using xylene (FIG. 3E).

Thereafter, the middle area of the silicon wafer 31 was etched using an aqueous potassium hydroxide (KOH) solution so that the thermally oxidized film 32 was uncovered (FIG. 3F). The thermally oxidized film 32 was then subjected to chemical dry etching to be removed under conditions of CF$_4$: 20 SCCM, a gas pressure of $1.2 \times 10^{-1}$ Torr and a discharge electric power of 680 W (FIG. 3G).

Figure 3H:
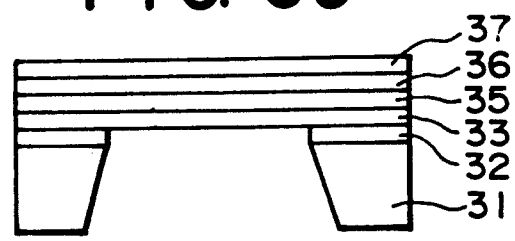

Next, the processed wafer with the aluminum nitride film 33 on the surface was set in a sputtering apparatus. The tungsten nitride film 35 (W-N; N/W=1/1) of 0.7 μm thick was formed on the aluminum nitride film 33, using a tungsten (W) target under conditions of argon (Ar): nitrogen (N$_2$)=2:1, a gas pressure of 0.02 Torr and a discharge electric power of 500 W, and the polyimide layer 36 was also formed on the layer 35 to have a thickness of 1 μm. Then the silicon-containing resist 37 was further formed thereon with a thickness of 0.2 μm (FIG. 3H).

Next, the silicon-containing resist 37 was subjected to patterning by EB drawing to give a 0.25 μm line-and-space pattern. Subsequently, the resulting pattern was transferred to the polyimide film by reactive-ion etching using oxygen gas.

Figure 3I:
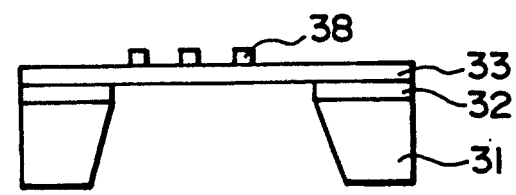

Using this pattern as a mask, the tungsten nitride film 35 was etched by reactive-ion etching using CF$_4$+O$_2$ gas, under conditions of a gas pressure of 1.0 Pa and an RF power of 0.2 W/cm$^2$ to form the pattern 38 of the tungsten nitride film 35. The X-ray mask structure of the present invention was thus obtained (FIG. 3I).

Example 2

On the whole surface of the silicon wafer 31, the silicon nitride film 32 of 2 μm thick was formed by LPCVD (FIG. 3A).

The resulting wafer 31 was then set in an MOCVD apparatus. While the wafer 31 was heated to 500° C., trimethylaluminum (Al(CH$_3$)$_3$) was fed by bubbling with 50 SCCM of hydrogen gas, and 10 SCCM of ammonia (NH$_3$) gas was introduced, to form the aluminum nitride film 33 (N/Al=0.9/1) (FIG. 3B).

Next, the negative resist (OMR-83; a product of Tokyo Ohka Kogyo Co., Ltd.) layer 34 was formed in the shape of a ring (FIG. 3C), and, using this layer as a resist layer, the middle area of the silicon nitride film 32 was removed using a mixed solution of ammonium fluoride and hydrofluoric acid (FIG. 3D), followed by removal of the resist using a remover solution exclusively used therefor (FIG. 3E).

Subsequently, the silicon wafer 31 was etched from the back using a mixed solution of hydrofluoric acid and nitric acid (FIG. 3F). The silicon nitride film thus uncovered was then subjected to chemical dry etching to be removed under conditions of CF$_4$: 20 SCCM, a gas pressure of $1.2 \times 10^{-1}$ Torr and a discharge electric power of 680 W (FIG. 3G).

Next, the processed wafer with the resulting aluminum nitride film was set in a sputtering apparatus. The tantalum nitride film 35 (Ta-N; N/Ta=1/1) of 0.8 m thick was formed on the aluminum nitride film 33, using a tantalum (Ta) target under conditions of argon: nitrogen=1:1, a gas pressure of 0.01 Torr and a discharge electric power of 500 W.

The polyimide layer 36 was subsequently formed on the tantalum nitride film 35 to have a thickness of 1 μm. Then the silicon-containing resist 37 was further formed thereon with a thickness of 0.2 μm (FIG. 3H).

Next, the silicon-containing resist 37 was subjected to patterning by EB drawing to give a 0.25 μm line-and-space pattern. Subsequently, the resulting pattern was transferred to the polyimide film by reactive-ion etching using oxygen gas. Using this pattern as a mask, the tantalum nitride film 35 was etched by reactive-ion etching using $Cl_2$ gas, under conditions of a gas pressure of 1.0 Pa and an RF power of 0.2 W/cm$^2$ to form the pattern 38 of tantalum nitride. The X-ray mask structure of the present invention was thus obtained (FIG. 3I).

Example 3

On the whole surface of the silicon wafer 31, the silicon oxide film 32 of 2 μm thick was formed by the thermal oxidation process (FIG. 3A).

The wafer 31 was then set in a high frequency MoCVD apparatus. While the wafer 31 was heated to 1,200° C., aluminum chloride ($AlCl_3$) was fed by bubbling with 100 SCCM of hydrogen gas, and 10 SCCM of ammonia gas was introduced, to form the aluminum nitride film 33 (N/Al=0.95/1) at a discharge electric power of 300 W (FIG. 3B).

Next, the negative resist 34 (AZ-1370; a product of Hoechst Ltd.) was formed in the shape of a ring (FIG. 3C), and, using this layer as a resist layer, the middle area of the thermally oxidized film 32 was removed using a mixed solution of ammonium fluoride and hydrofluoric acid (FIG. 3D), followed by removal of the resist using a remover solution exclusively used therefor (FIG. 3E).

Subsequently, the middle area of the silicon wafer 31 was etched using an aqueous potassium hydroxide solution (FIG. 3F).

The processed wafer with the resulting aluminum nitride film was then set in a sputtering apparatus. The tungsten nitride film 35 (N/W=1/1) of 0.8 μm thick was formed on the aluminum nitride film 33, using a tungsten (W) target under conditions of argon: nitrogen=2:1, a gas pressure of 0.02 Torr and a discharge electric power of 500 W.

The chromium (Cr) layer 36 was subsequently formed on the tungsten nitride film 35 by EB vacuum deposition to have a thickness of 500 Å. Then the polymethyl methacrylate (PMMA) resist 37 was further formed thereon with a thickness of 1 μm (FIG. 3H).

Next, the polymethyl methacrylate resist 37 was subjected to patterning by EB drawing to give a 0.25 μm line-and-space pattern. Subsequently, using the resulting polymethyl methacrylate pattern as a mask, the chromium layer 36 was etched by reactive-ion etching using chlorine gas, thus a pattern transfer was effected. Subsequently, using this chromium pattern as a mask, the tungsten nitride film 35 was subjected to patterning by reactive-ion etching using sulfur hexafluoride (SF6) gas, followed by chemical dry etching from the back to remove the silicon oxide. The X-ray mask structure of the present invention was thus obtained (FIG. 3I).

Example 4

Example 4 was carried out with the same manner in Example 3, except that the tungsten nitride film in Example 3 was replaced by a hafnium nitride (Hf-N) film. The X-ray mask structure of the present invention was thus obtained.

Example 5

Figure 4A:
Figure 4B:
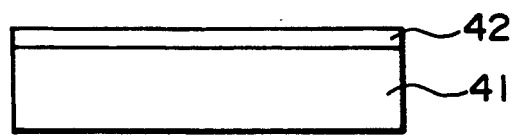

The silicon wafer 41 (FIG. 4A) was set in a sputtering apparatus. The aluminum nitride film 42 (N/Al=1/1) of 2 μm thick was formed using an aluminum nitride (Al-N) target under conditions of $Ar:N_2=5:1$, a gas pressure of 0.01 Torr and a discharge electric power of 200 W. (FIG. 4B).

Figure 4C:
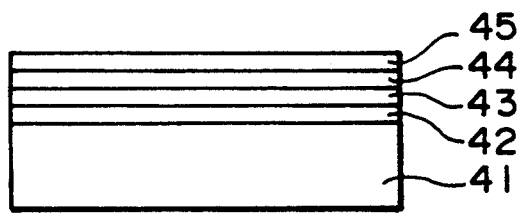

Next, the tungsten nitride film 43 (W-N, N/W=1/1) of 0.7 μm thick was formed on the aluminum nitride film 42, using a tungsten target under conditions of $Ar:N_2=2:1$, a gas pressure of 0.02 Torr and a discharge electric power of 500 W, and the polyimide layer 44 was also formed on the layer 43 to have a thickness of 1 μm. Then the silicon-containing resist 45 was further formed thereon with a thickness of 0.2 μm (FIG. 4C).

Next, the silicon-containing resist 45 was subjected to patterning by EB drawing to give a 0.25 μm line-and-space pattern. Subsequently, the resulting pattern was transferred to the polyimide film by reactive-ion etching using oxygen gas.

Figure 4D:
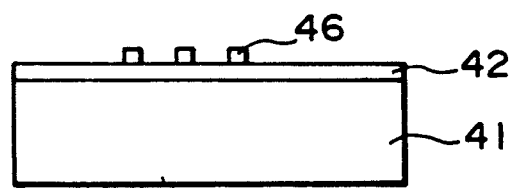

Using this pattern as a mask, the tungsten nitride film 43 was etched by reactive-ion etching using $CF_4+O_2$ gas, under conditions of a gas pressure of 1.0 Pa and an RF power of 0.2 W/cm$^2$ to form a pattern 46 of the tungsten nitride film (FIG. 4D).

Figure 4E:
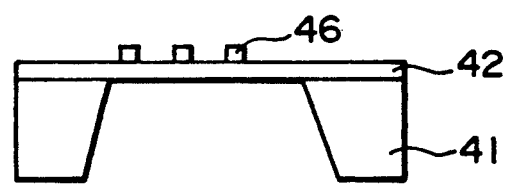

Thereafter, the middle area of the silicon wafer 41 was etched using an aqueous KOH solution. The X-ray mask structure of the present invention, as shown in FIG. 4E, was thus obtained.

Example 6

Figure 5A:
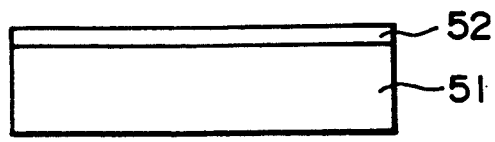
Figure 5B:
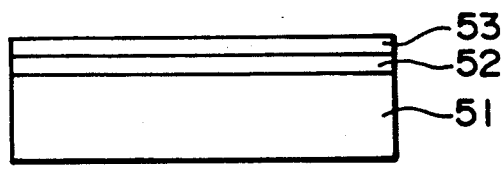

The silicon wafer 51, on which the polyimide layer 52 used as a protective layer had been formed with a thickness of 1 μm, (FIG. 5A), was set in a sputtering apparatus. The aluminum nitride film 53 (N/Al=1/1) of 2 μm thick was formed thereon using an aluminum nitride (Al/N) target under conditions of $Ar:N_2=5:1$, a gas pressure of 0.01 Torr and a discharge electric power of 200 W. (FIG. 5B).

Figure 5C:
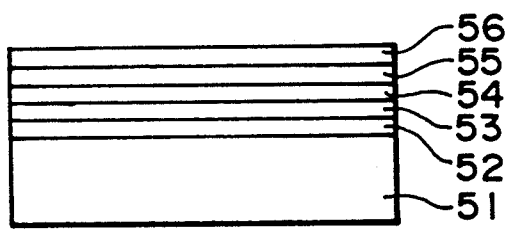

Next, the processed wafer with the aluminum nitride film 53 on the surface was set in a sputtering apparatus. The tungsten nitride film 54 (W-N, N/W=1/1) of 0.7 μm thick was formed on the aluminum nitride film 53, using a tungsten (W) target under conditions of $Ar:N_2=2:1$, a gas pressure of 0.02 Torr and a discharge electric power of 500 W, and the polyimide layer 55 was also formed on the layer 54 to have a thickness of 1 μm. Then the silicon-containing resist 56 was further formed thereon with a thickness of 0.2 μm (FIG. 5C).

Next, the silicon-containing resist 56 was subjected to patterning by EB drawing to give a 0.25 μm line-and-space pattern. Subsequently, the resulting pattern was transferred to the polyimide film 55 by reactive-ion etching using oxygen gas.

Figure 5D:
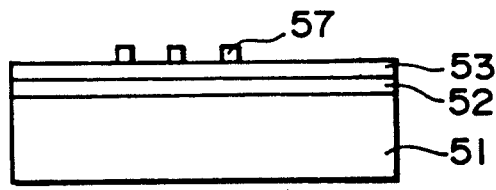

Using this pattern as a mask, the tungsten nitride film 54 was etched by reactive-ion etching using $CF_4+O_2$ gas, under conditions of a gas pressure of 1.0 Pa and an RF power of 0.2 W/cm$^2$ to form the pattern 57 of the tungsten nitride film (FIG. 5D).

Figure 5E:
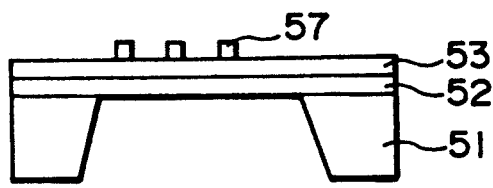

Thereafter, the middle area of the silicon wafer 51 was etched using an aqueous potassium hydroxide (KOH) solution. The X-ray mask structure of the present invention, as shown in FIG. 5E, having the polyimide layer as the protective layer, was thus obtained.

Example 7

On the X-ray mask structure prepared in Example 5, a protective layer made of polyimide was further formed with a thickness of 2 μm. The X-ray mask structure of the present invention, as shown in FIG. 1B, was thus obtained.

Example 8

On the X-ray mask structure prepared in Example 5, a protective layer made of polyimide was further formed with a thickness of 1 μm. The X-ray mask structure of the present invention, as shown in FIG. 1D, was thus obtained.

Example 9

Figure 6A:

The silicon wafer 61 was set in a sputtering apparatus having three types of targets: an aluminum nitride (Al-N) target, a mixed target of aluminum nitride (Al-N) and tungsten nitride (W-N) and a tungsten nitride (W-N) target (FIG. 6A).

First, using the aluminum nitride (Al-N) target, the aluminum nitride film 62 (N/Al=1/1) of 2 μm thick was formed under conditions of Ar:$N_2$=5:1, a gas pressure of 0.01 Torr and a discharge electric power of 200 W.

Second, using the mixed target of aluminum nitride (Al-N) and tungsten nitride (W-N), the Al-W-N layer 63 (Al:W:N=1:0.4:1.5) was formed under the same conditions.

Figure 6B:
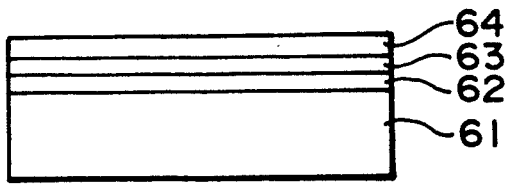

The tungsten nitride film 64 (W-N; N/W=1/1) of 0.7 μm thick was subsequently formed (FIG. 6B).

Figure 6C:
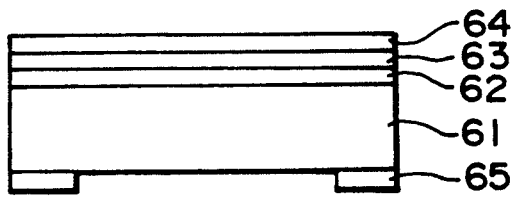

Next, in order to etch the middle area of the silicon wafer 61 from the back, the Apiezon wax (a product of Shell Chemical Co.) layer 65 was formed (FIG. 6C), and, using this layer as a resist layer, the middle area of the silicon wafer 61 was etched using an aqueous KOH solution.

Figure 6D:
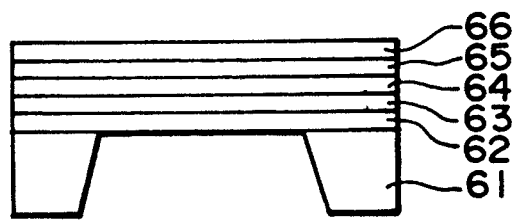

Next, the polyimide layer 65 was formed on the tungsten nitride film 64 to have a thickness of 1 μm. Then the silicon-containing resist 66 was further formed thereon with a thickness of 0.2 μm (FIG. 6D).

Next, the silicon-containing resist 66 was subjected to patterning by electron beam (EB) drawing to give a 0.25 μm line-and-space pattern. Subsequently, the resulting pattern was transferred to the polyimide film by reactive-ion etching (RIE) using oxygen ($O_2$) gas.

Figure 6E:
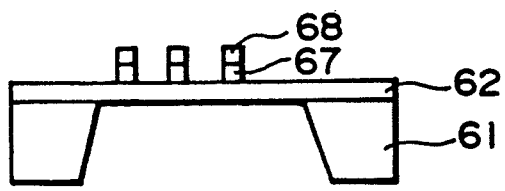

Using this pattern as a mask, the tungsten nitride film 64 and the Al-W-N layer 63 were etched by reactive-ion etching using $CF_4+O_2$ gas, under conditions of a gas pressure of 1.0 Pa and a discharge electric power of 0.2 W/$cm^2$ to form the tungsten nitride film 68 and the Al-W-N layer (the intermediate layer) 67. The X-ray mask structure of the present invention was thus obtained (FIG. 6E).

Example 10

On the whole surface of the silicon wafer 71, the silicon nitride film 72 of 0.2 μm thick was formed by the low-pressure chemical vapor deposition (LPCVD) process (FIG. 7A).

The resulting wafer 71 was then set in an MOCVD apparatus. While the wafer 71 was heated to 500° C., trimethylaluminum (Al($CH_3$)$_3$) was fed by bubbling with 50 SCCM of hydrogen ($H_2$) gas, and 10 SCCM of ammonia ($NH_3$) gas was introduced, to form the aluminum nitride film 73 (N/Al=1/1) (FIG. 7B).

Next, the negative resist (OMR-83; a product of Tokyo Ohka Kogyo Co., Ltd.) layer 74 was formed in the shape of a ring (FIG. 7C), and, using this layer as a resist layer, the middle area of the silicon nitride film 72 was removed using a mixed solution of ammonium fluoride and hydrofluoric acid (FIG. 7D), followed by removal of the resist layer 74 using a remover solution exclusively used therefor (FIG. 7E).

Thereafter, the silicon wafer 71 was etched from the back, using a mixed solution of hydrofluoric acid and nitric acid (FIG. 7F).

The silicon nitride film thus uncovered was then subjected to chemical dry etching for its removal under conditions of $CF_4$: 20 SCCM, a gas pressure of $1.2\times10^{-1}$ Torr and a discharge electric power of 680 W (FIG. 7G).

Subsequently, using a sputtering apparatus having two types of targets of an aluminum nitride (A(-N) target and a tantalum nitride (Ta-N), of a substrate rotation system capable of deposition of a composite film, the Al-Ta-N (A(:Ta:N=1:0.4:1.5) layer (the intermediate layer) 75 was formed under conditions of Ar:$N_2$=1:1, a gas pressure of 0.01 Torr and a discharge electric power of 500 W.

Next, using a tantalum (Ta) target, sputtering was carried out in another sputtering apparatus under the same conditions, to form the tantalum nitride (Ta-N) film 76 of 0.8 μm thick. (N/Ta=1/1)

The polyimide layer 77 was subsequently formed on the tantalum nitride film 76 to have a thickness of 1 μm. Then the silicon-containing resist 78 was further formed thereon with a thickness of 0.2 μm (FIG. 7H).

Next, the silicon-containing resist 78 was subjected to patterning by EB drawing to give a 0.25 μm line-and-space pattern.

The resulting pattern was subsequently transferred to the polyimide film by reactive-ion etching using oxygen gas.

Using this pattern as a mask, the tantalum nitride film was etched by reactive-ion etching using trifluorobromomethane ($CBrF_3$) gas, under conditions of a gas pressure of $5\times10^{-3}$ Torr and a discharge electric power of 0.3 W/$cm^2$ to form the pattern 79 of the tantalum nitride film. The X-ray mask structure of the present invention, having the intermediate layer 73, was thus obtained (FIG. 7I).

Example 11

Figure 9A:
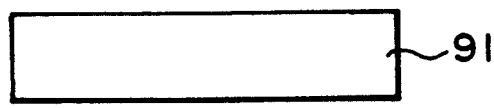
Figure 9B:
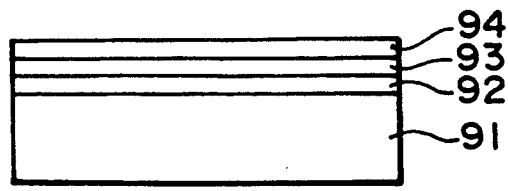

The silicon wafer 91 was set in an MOCVD apparatus of a high-frequency discharge system (FIG. 9A). While the silicon wafer 91 was heated to 1,200° C., aluminum chloride ($AlCl_3$) was fed by bubbling with 100 SCCM of hydrogen gas, and 10 SCCM of ammonia ($NH_3$) gas was introduced, to form the aluminum nitride (Al-N) film 92 (N/Al=1/1) (FIG. 9B).

Next, in a sputtering apparatus in which a mixed target of aluminum nitride (Al-N) and tungsten nitride (W-N) was used, the Al-W-N layer 93 (Al:W:N=1:0.4:1.4) of 0.25 μm thick was formed under conditions of Ar:$N_2$=2:1, a gas pressure of 0.02 Torr and a discharge electric power of 500 W.

Figure 9C:
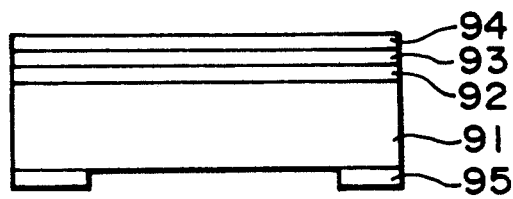

Subsequently, sputtering using a tungsten nitride (W-N) target was carried out under the same conditions to form the tungsten nitride (W-N) film 94 of 0.8 μm thick (FIG. 9C). Thereafter, the Cr layer 95 was further formed by deposition with a thickness of 500 Å in Ar gas.

Figure 9D:
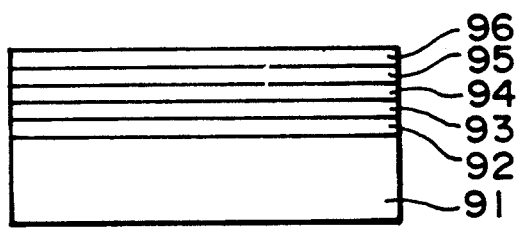

Next, the polymethyl methacrylate (PMMA; OEBR-1000; a product of Tokyo Ohka Kogyo Co., Ltd.) resist layer 96 was formed on the Cr layer 95 to have a thickness of 1 μm (FIG. 9D).

The PMMA resist layer 96 was then subjected to patterning by EB drawing to give a 0.25 μm line-and-space pattern. Subsequently, using the resulting PMMA pattern as a mask, the Cr layer 95 was etched by reactive-ion etching using $Cl_2$ gas to transfer the pattern.

Figure 9E:
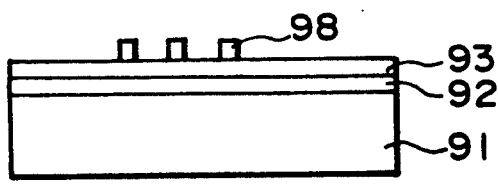
Figure 9F:
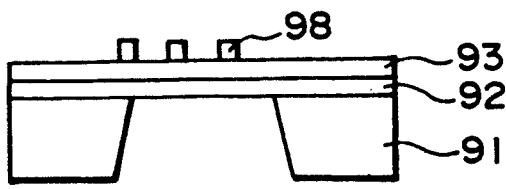

Using this Cr pattern as a mask, the tungsten nitride (W-N) film 94 was subjected to patterning using $SF_6$ to form the absorber pattern 98 (FIG. 9E). Thereafter, the middle area of the silicon wafer 91 was etched from the back using an aqueous KOH solution. The X-ray mask structure of the present invention was thus obtained (FIG. 9F).

Example 12

On the X-ray mask structure prepared in Example 9, a protective layer made of polyimide was further formed with a thickness of 2.5 μm. The X-ray mask structure of the present invention, as shown in FIG. 2C, was thus obtained.

Example 13

On the X-ray mask structure prepared in Example 9, a protective layer made of polyimide was further formed with a thickness of 1.5 μm. The X-ray mask structure of the present invention, as shown in FIG. 2E, was thus obtained.

Example 14

Figure 8A:
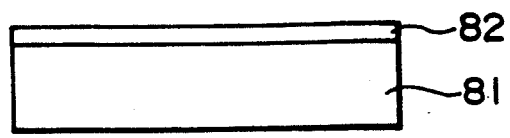
Figure 8B:
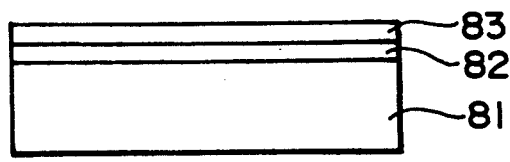

The silicon wafer 81, on which the polyimide layer 82 serving as a protective layer had been formed with a thickness of 2 μm (FIG. 8A), was set in a sputtering apparatus. The aluminum nitride film 83 (N/Al=1/1) of 2 μm thick was formed thereon using an aluminum nitride (Al-N) target under conditions of $Ar:N_2=5:1$, a gas pressure of 0.01 Torr and a discharge electric power of 200 W. (FIG. 8B).

Subsequently, using two targets of an aluminum nitride (Al-N) target and a tungsten nitride (W-N) target, and also using a substrate rotation system in combination, the Al-W-N layer 84 (Al:W:N=1:0.4:1.4) was formed under conditions of $Ar:N_2=2:1$, a gas pressure of 0.02 Torr and a discharge electric power of 500 W.

Figure 8C:
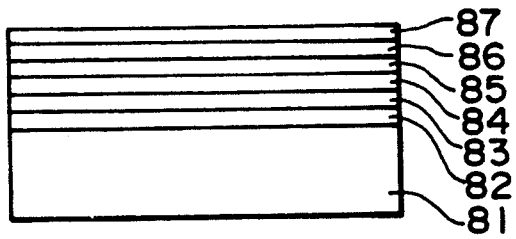

Next, using a tungsten (W) target, sputtering was carried out under the same conditions to form thereon the tungsten nitride film 85 (W-N, N/W=1/1) of 0.7 μm thick. Then the polyimide film 86 was further formed on the film 85 to have a thickness of 1 μm, and the silicon-containing resist 87 was further formed thereon with a thickness of 0.2 μm (FIG. 8C).

The silicon-containing resist 87 was then subjected to patterning by EB drawing to give a 0.25 μm line-and-space pattern. Subsequently, the resulting pattern was transferred to the polyimide film 86 by reactive-ion etching using oxygen gas.

Figure 8D:
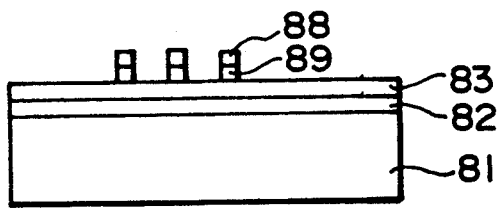

Using this pattern as a mask, the tungsten nitride film 85 and the Al-W-N layer 84 were etched. Here, the tungsten nitride film 85 was etched by reactive-ion etching using $CF_4+O_2$ gas under conditions of a gas pressure of 1.0 Pa and an RF power of 0.2 $W/cm^2$, and the Al-W-N layer 84 was etched under the same conditions except for the addition of $Cl_2$ gas, to form patterns (88 and 89) comprising tungsten nitride and Al-W-N (FIG. 8D).

Figure 8E:
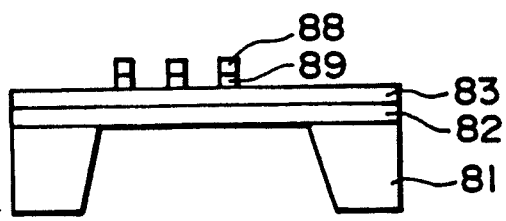

Thereafter, the middle area of the silicon wafer 81 was etched from the back using an aqueous KOH solution. The X-ray mask structure of the present invention, having the polyimide layer 82 as the protective layer, was thus obtained (FIG. 8E).

Comparative Example 1

Example 11 was repeated to prepare an X-ray mask structure, except that the tungsten nitride layer was replaced with a tungsten layer and the Al-W-N layer was not provided.

Comparative Example 2

Example 11 was repeated to prepare an X-ray mask structure, except that the aluminum nitride layer was replaced with a silicon nitride layer (N/Si=1/1) and the Al-W-N layer was not provided.

Example 15

The X-ray mask structures prepared in Examples 1 to 14 (provided that, in the present Use Example, the X-ray absorber pattern-width was made to be 0.25 μm) were each set on the surface of a silicon wafer (the exposing object) coated with a resist material (RAY-PF; a product of Hoechst Ltd.), which was then exposed to light to form a mask (absorber) pattern on the exposing object, using soft X-rays with a wavelength of 1 nm, taken out by spectroscopy of SOR light.

Here, the amount of exposure was so controlled as to be 75 $mJ/cm^2$ on the silicon wafer, and the exposure was carried out in an atmosphere of He gas under a pressure of 150 Torr.

As a result of the above exposure, it was possible to carry out transfer of patterns with a high resolution in such an accuracy that an error $\sigma$ is $\pm 0.03$ μm with respect to the design width of 0.25 μm, when any of X-ray mask structures prepared in Examples 1 to 14 were used.

Example 16

The X-ray mask structures prepared in Examples 1 to 14 and Comparative Examples 1 and 2 (provided that, in the present Use Example, the X-ray absorber pattern-width was made to be 0.35 μm) were each set on the surface of the same silicon wafer (the exposing object) as that used in Example 15, which was then exposed to light to form a mask (absorber) pattern on the exposing object under the same conditions as in Example 15, provided that X-rays were irradiated for 10 seconds for each one shot, and this was repeated 10,000 times on the same X-ray mask structure. The pressure of the exposure atmosphere was also returned to atmospheric pressure every time when the above one shot of X-ray irradiation was completed.

Results obtained are shown in Table 1. Here, evaluation was made based on the amount of change ($\Delta x$) between the transferred pattern width (μm) on the silicon wafer obtained by the first exposure of X-ray and the transferred pattern width (μm) on the silicon wafer obtained by the exposure of X-ray, at number of shots of 100, 500, 1,000, 5,000 and 10,000.

TABLE 1

| Number of Shots | Examples 1 to 8 | Examples 9 to 14 | Comparative Example 1 | Comparative Example 2 |
| --- | --- | --- | --- | --- |
| 100 | AA | AA | A | B |
| 500 | AA | AA | B | C |
| 1,000 | A | AA | C | C |
| 5,000 | A | A | C | C |
| 10,000 | B | A | C | C |

In Table 1;
AA: 0.01 μm ≧ $\Delta x$;
A: 0.02 μm ≧ $\Delta x$ > 0.01 μm;
B: 0.03 μm ≧ $\Delta x$ > 0.02 μm; and
C: 0.03 μm < $\Delta x$.

We claim:

1. An X-ray mask structure comprising an X-ray transmissive membrane, an X-ray absorber held on said X-ray transmissive membrane, and a holding frame that holds said X-ray transmissive membrane, wherein;

said X-ray transmissive membrane comprises a layer of aluminum nitride;

said X-ray absorber comprises a nitride of heavy metal; and an intermediate layer mainly composed of aluminum, a heavy metal and nitrogen is further held between said X-ray transmissive membrane and said X-ray absorber.

2. The X-ray mask structure according to claim 1, wherein said aluminum nitride is $AlN_x$ ($0.3 < x < 1.5$).

3. The X-ray mask structure according to claim 1, wherein said nitride of heavy metal is $MN_y$ ($0 < y < 1$; M is a heavy metal)).

4. The X-ray mask structure according to claim 3, wherein said heavy metal is at least one selected from the group consisting of W, Ta, Hf, Mo, Nb, Zr, Ni, Ti, Rh, Ge and Ga.

5. The X-ray mask structure according to claim 1, wherein the compositional ratio of aluminum, a heavy metal and nitrogen in said intermediate layer is 1:3 to 0.001:5 to 0.3.

6. The X-ray mask structure according to claim 5, wherein said heavy metal is at least one selected from the group consisting of W, Ta, Hf, Mo, Nb, Zr, Ni, Ti, Rh, Ge and Ga.

7. The X-ray mask structure according to claim 1, wherein said X-ray transmissive membrane further comprises a layer of organic material.

8. The X-ray mask structure according to claim 7, wherein said layer of organic material comprises at least one compound selected from the group consisting of polyimide, polyamide, polyester and polyparaxylylene.

9. The X-ray mask structure according to claim 1, wherein said X-ray transmissive membrane further comprises a layer of inorganic material.

10. The X-ray mask structure according to claim 9, wherein said inorganic material comprises at least one selected from the group consisting of Be, Ti, Si and B.

11. An X-ray exposure process comprising exposing an exposing object to X rays through an X-ray mask structure comprising an X-ray transmissive membrane, an X-ray absorber held on said X-ray transmissive membrane, and a holding frame that holds said X-ray transmissive membrane, wherein;

said X-ray transmissive membrane comprises a layer of aluminum nitride;

said X-ray absorber comprises a nitride of heavy metal; and an intermediate layer mainly composed of aluminum, a heavy metal and nitrogen is further held between said X-ray transmissive membrane and said X-ray absorber.

12. The X-ray exposure process according to claim 11, wherein said aluminum nitride is $AlN_x$ ($0.3 < x < 1.5$).

13. The X-ray exposure process according to claim 11, wherein said nitride of heavy metal is $MN_y$ ($0 < y < 1$; M is a heavy metal).

14. The X-ray exposure process according to claim 13, wherein said heavy metal is at least one selected from the group consisting of W, Ta, Hf, Mo, Nb, Zr, Ni, Ti, Rh, Ge and Ga.

15. The X-ray exposure process according to claim 11, wherein the compositional ratio of aluminum, a heavy metal and nitrogen in said intermediate layer is 1:3 to 0.001:5 to 0.3.

16. The X-ray exposure process according to claim 15, wherein said heavy metal is at least one selected from the group consisting of W, Ta, Hf, Mo, Nb, Zr, Ni, Ti, Rh, Ge and Ga.

17. The X-ray exposure process according to claim 11, wherein said X-ray transmissive membrane further comprises a layer of organic material.

18. The X-ray exposure process according to claim 17, wherein said layer of organic material comprises at least one compound selected from the group consisting of polyimide, polyamide, polyester and polyparaxylylene.

19. The X-ray exposure process according to claim 11, wherein said X-ray transmissive membrane further comprises a layer of inorganic material.

20. The X-ray exposure process according to claim 19, wherein said layer of inorganic material comprises at least one selected from the group consisting of Be, Ti, Si and B.

* * * * *

UNITED STATES PATENT AND TRADEMARK OFFICE
CERTIFICATE OF CORRECTION

PATENT NO. : 5,196,283
DATED : March 23, 1993
INVENTOR(S) : TSUTOMU IKEDA, ET AL.

Page 1 of 2

It is certified that error appears in the above-identified patent and that said Letters Patent is hereby corrected as shown below:

COLUMN 1

Line 41, "63-32425" should read --63-232425--.

COLUMN 2

Line 44, "an exposing" should read --exposing an--.
Line 51, "and;" should read --nitride; and--.
Line 55, "an exposing" should read --exposing an--.

COLUMN 3

Line 27, "c): a)" should read --c): ¶ a)--.
Line 32, "260 W/m.K." should read --260 W/m·K.--.
Line 37, "(17 to 30 W/m.K)" should read --(17 to 30 W/m·K)--.

COLUMN 7

Line 14, "MoCVD" should read --MOCVD--.

COLUMN 10

Line 10, "(A(-N)" should read --(Al-N)--.
Line 13, "(A(:Ta:N" should read --(Al:Ta:N--.

UNITED STATES PATENT AND TRADEMARK OFFICE
CERTIFICATE OF CORRECTION

PATENT NO. : 5,196,283

DATED : March 23, 1993

INVENTOR(S) : TSUTOMU IKEDA, ET AL.

Page 2 of 2

It is certified that error appears in the above-identified patent and that said Letters Patent is hereby corrected as shown below:

COLUMN 13

Line 17, "metal))." should read --metal).--.
Line 41, "said inorganic" should read --said layer of inorganic--.

Signed and Sealed this

Twenty-ninth Day of March, 1994

Attest:

BRUCE LEHMAN

Attesting Officer

Commissioner of Patents and Trademarks